United States Patent
Lin et al.

(10) Patent No.: US 10,431,423 B2
(45) Date of Patent: Oct. 1, 2019

(54) METHOD OF FABRICATING AN INTEGRATED CIRCUIT WITH A PATTERN DENSITY-OUTLIER-TREATMENT FOR OPTIMIZED PATTERN DENSITY UNIFORMITY

(71) Applicant: Taiwan Semiconductor Manufacturing Company, Ltd., Hsinchu (TW)

(72) Inventors: Jyuh-Fuh Lin, Miaoli County (TW); Cheng-Hung Chen, Hsinchu County (TW); Pei-Yi Liu, Changhua County (TW); Wen-Chuan Wang, Hsinchu (TW); Shy-Jay Lin, Hsinchu County (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/220,614

(22) Filed: Dec. 14, 2018

(65) Prior Publication Data

US 2019/0214227 A1   Jul. 11, 2019

Related U.S. Application Data

(63) Continuation of application No. 15/413,071, filed on Jan. 23, 2017, now Pat. No. 10,170,276, which is a
(Continued)

(51) Int. Cl.
| | |
|---|---|
| *G06F 17/50* | (2006.01) |
| *H01J 37/317* | (2006.01) |
| *H01L 21/027* | (2006.01) |

(52) U.S. Cl.
CPC ...... *H01J 37/3174* (2013.01); *H01L 21/0277* (2013.01); *H01J 2237/31761* (2013.01); *H01J 2237/31769* (2013.01)

(58) Field of Classification Search
USPC .................................. 716/51, 52, 53, 54, 55
See application file for complete search history.

(56) References Cited

U.S. PATENT DOCUMENTS

| | | | |
|---|---|---|---|
| 6,507,034 B1 * | 1/2003 | Nakasugi | B82Y 10/00 250/397 |
| 7,425,392 B2 | 9/2008 | Nordquist et al. | |

(Continued)

FOREIGN PATENT DOCUMENTS

| | | |
|---|---|---|
| CN | 1450407 | 10/2003 |
| KR | 1020080044402 A | 5/2008 |
| KR | 1020100025822 A | 3/2010 |

*Primary Examiner* — Brian Ngo
(74) *Attorney, Agent, or Firm* — Haynes and Boone, LLP

(57) ABSTRACT

The present disclosure provides one embodiment of an IC method. First pattern densities (PDs) of a plurality of templates of an IC design layout are received. Then a high PD outlier template and a low PD outlier template from the plurality of templates are identified. The high PD outlier template is split into multiple subsets of template and each subset of template carries a portion of PD of the high PD outlier template. A PD uniformity (PDU) optimization is performed to the low PD outlier template and multiple individual exposure processes are applied by using respective subset of templates.

20 Claims, 11 Drawing Sheets

Related U.S. Application Data continuation of application No. 14/483,893, filed on Sep. 11, 2014, now Pat. No. 9,552,964.

(60) Provisional application No. 62/014,997, filed on Jun. 20, 2014.

(56) References Cited

U.S. PATENT DOCUMENTS

| | | | |
|---|---|---|---|
| 7,444,615 | B2 | 10/2008 | Percin et al. |
| 7,617,477 | B2 | 11/2009 | Ye et al. |
| 7,883,831 | B2 | 2/2011 | Wolfe et al. |
| 9,053,906 | B2 | 6/2015 | Platzgummer et al. |
| 9,436,787 | B2 | 9/2016 | Lin et al. |
| 9,436,788 | B2 | 9/2016 | Lin et al. |
| 9,594,862 | B2 | 3/2017 | Lin et al. |
| 2006/0266243 | A1* | 11/2006 | Percin ............... G03F 7/70441 101/484 |
| 2007/0048625 | A1* | 3/2007 | Nordquist ............ B82Y 10/00 430/5 |
| 2009/0042137 | A1* | 2/2009 | Wolfe ................. B82Y 10/00 430/296 |
| 2015/0028230 | A1* | 1/2015 | Platzgummer ...... H01J 37/3026 250/492.3 |
| 2015/0118625 | A1* | 4/2015 | Yang .................. B82Y 10/00 430/296 |
| 2015/0294057 | A1* | 10/2015 | Lin .................... G06F 17/5068 716/54 |
| 2015/0370942 | A1* | 12/2015 | Lin .................... G06F 17/5068 716/54 |

\* cited by examiner

METHOD OF FABRICATING AN INTEGRATED CIRCUIT WITH A PATTERN DENSITY-OUTLIER-TREATMENT FOR OPTIMIZED PATTERN DENSITY UNIFORMITY

PRIORITY DATA

This application is a continuation of U.S. patent application Ser. No. 15/413,071, filed on Jan. 23, 2017, issuing as U.S. Pat. No. 10,170,276, which is a continuation of U.S. patent application Ser. No. 14/483,893, filed on Sep. 11, 2014, now U.S. Pat. No. 9,552,964, which claims priority to U.S. Provisional Patent Application No. 62/014,997, filed on Jun. 20, 2014, the entire disclosures of which are herein incorporated by reference.

BACKGROUND

In integrated circuit (IC) manufacture, it is common to utilize optical proximity correction (OPC) to improve an imaging resolution of an IC pattern during a lithography patterning process. However, along with the progress of semiconductor technology, the feature sizes are continually getting smaller. The existing OPC methods to add various dummy features have a limited degree of freedom and effectiveness to tune the pattern density and poor uniformity of the pattern density. This presents issues such as space charge effect and micro-loading effect when an electron-beam lithography technology is used to form the IC pattern. Furthermore, during the process to insert dummy features, various simulations and calculations associated with the dummy features take more time, causing an increase in cost. Therefore, what is needed is a method for IC design and mask making to effectively and efficiently adjusting an IC pattern to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
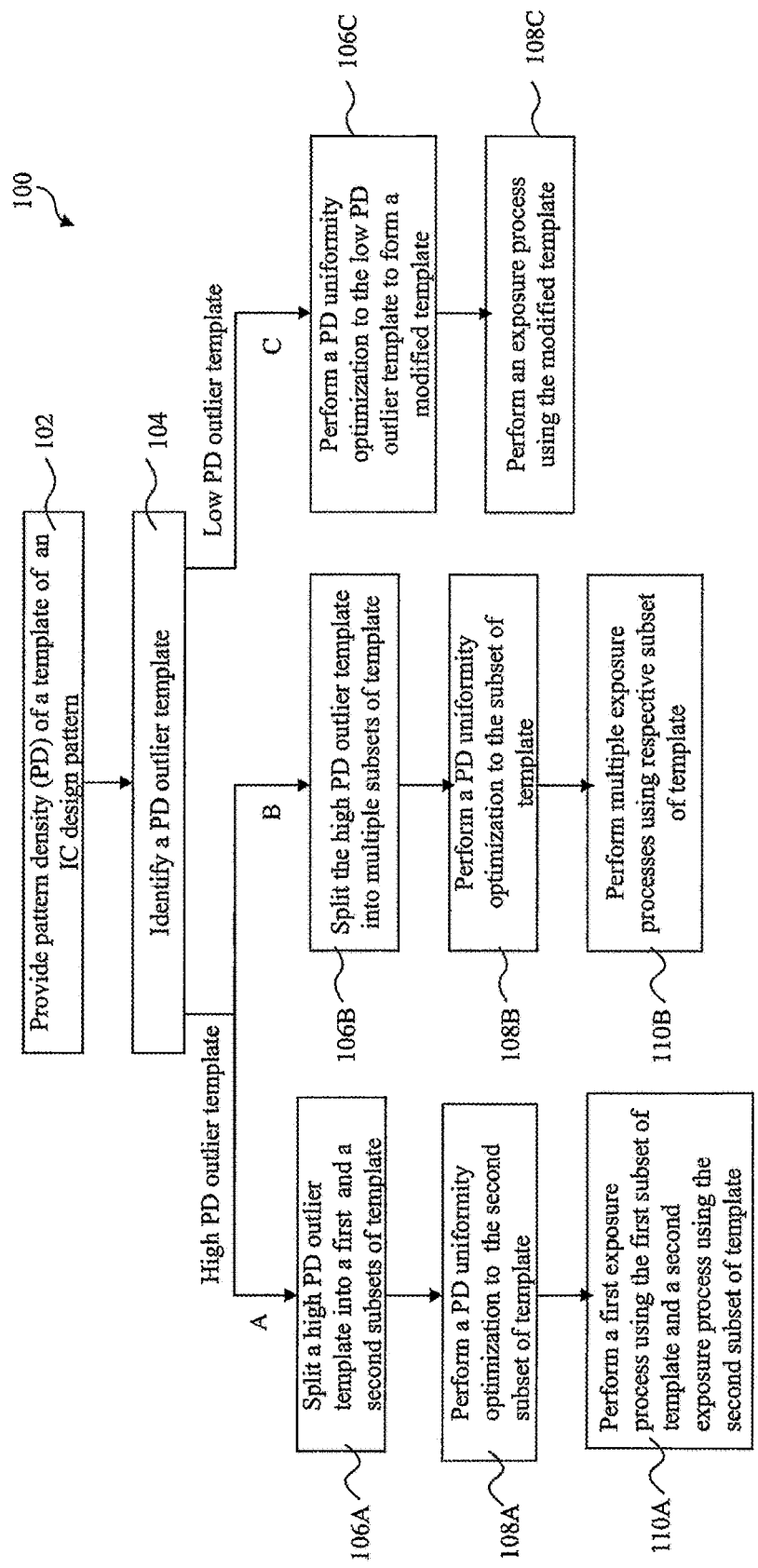
FIG. 1 is a flowchart of an embodiment of an integrated circuit (IC) method in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 for fabricating an integrated circuit (IC) according to various aspects of the present disclosure in one or more embodiments. The method 100 is described with reference to a device shown in FIGS. 2 through 11.

First, an IC design layout is provided by a designer. In one example, the designer is a design house. In another example, the designer is a design team separated from a semiconductor manufacture assigned for making IC products according to the IC design layout. In various embodiments, the semiconductor manufacturer is capable for making photomasks, semiconductor wafers, or both. The IC design layout includes various geometrical patterns designed for an IC product and based on the specification of the IC product.

The IC design layout is presented in one or more data files having the information of geometrical patterns. In one example, the IC design layout is expressed in a GDS or GDS-II format, as well known in the art. The designer, based on the specification of the IC product to be manufactured, implements a proper design procedure to generate the IC design layout. The design procedure may include logic design, physical design, and place and route. As an example, a portion of the IC design layout includes various IC features (also referred to as main features), such as active regions, gate electrodes, source and drains, metal lines, contacts/vias, and openings for bonding pads, to be formed on a semiconductor substrate (such as a silicon wafer) or on various material layers disposed over the semiconductor substrate. The IC design layout may include additional features, such as those features for imaging effect, processing enhancement, and/or mask identification information.

Figure 2:
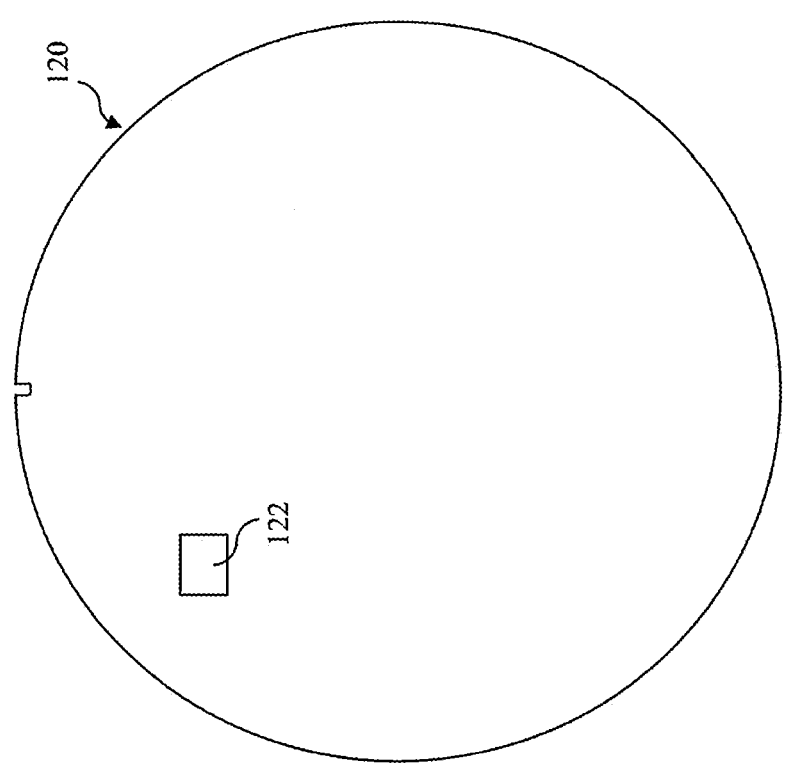
FIG. 2 is a schematic view of a semiconductor substrate constructed in accordance with some embodiments.

FIG. 2 illustrates a schematic view of a semiconductor substrate 120 constructed in accordance with some embodiments. In the present embodiment, the semiconductor substrate 120 is a semiconductor wafer, such as silicon wafer. In other embodiments, the semiconductor substrate 120 may alternatively or additionally include other semiconductor material, such as germanium (Ge), silicon germanium (SiGe), silicon carbide (SiC), indium arsenide (InAs), or indium phosphide (InP), or a suitable alloy semiconductor, such as silicon germanium carbide, gallium arsenic phosphide, or gallium indium phosphide. The semiconductor substrate 120 may include various doped regions, dielectric features, and multilevel interconnects. In one embodiment, the semiconductor substrate 120 includes various doped features for various microelectronic components, such as a complementary metal-oxide-semiconductor field-effect transistor (CMOSFET), imaging sensor, memory cell, and/or capacitive element. In another embodiment, the semiconductor substrate 120 includes conductive material features and dielectric material features configured for coupling and isolating various microelectronic components, respectively. In another embodiment, the semiconductor substrate 120 includes one or more material layers (such as a dielectric material layer) formed thereon.

The semiconductor substrate 120 further includes various circuit regions, represented by a single region 122 as shown in FIG. 2, although more regions can exist on the substrate. One or more ICs are to be formed in each circuit region 122, separated from each other by scribe lines. In one embodiment, an IC design layout for a single IC chip is to be formed in each of the circuit regions 122. For the sake of further example, and not intended to be limiting, the following discussion will refer to a one-chip region, as IC chip 122.

Figure 3:
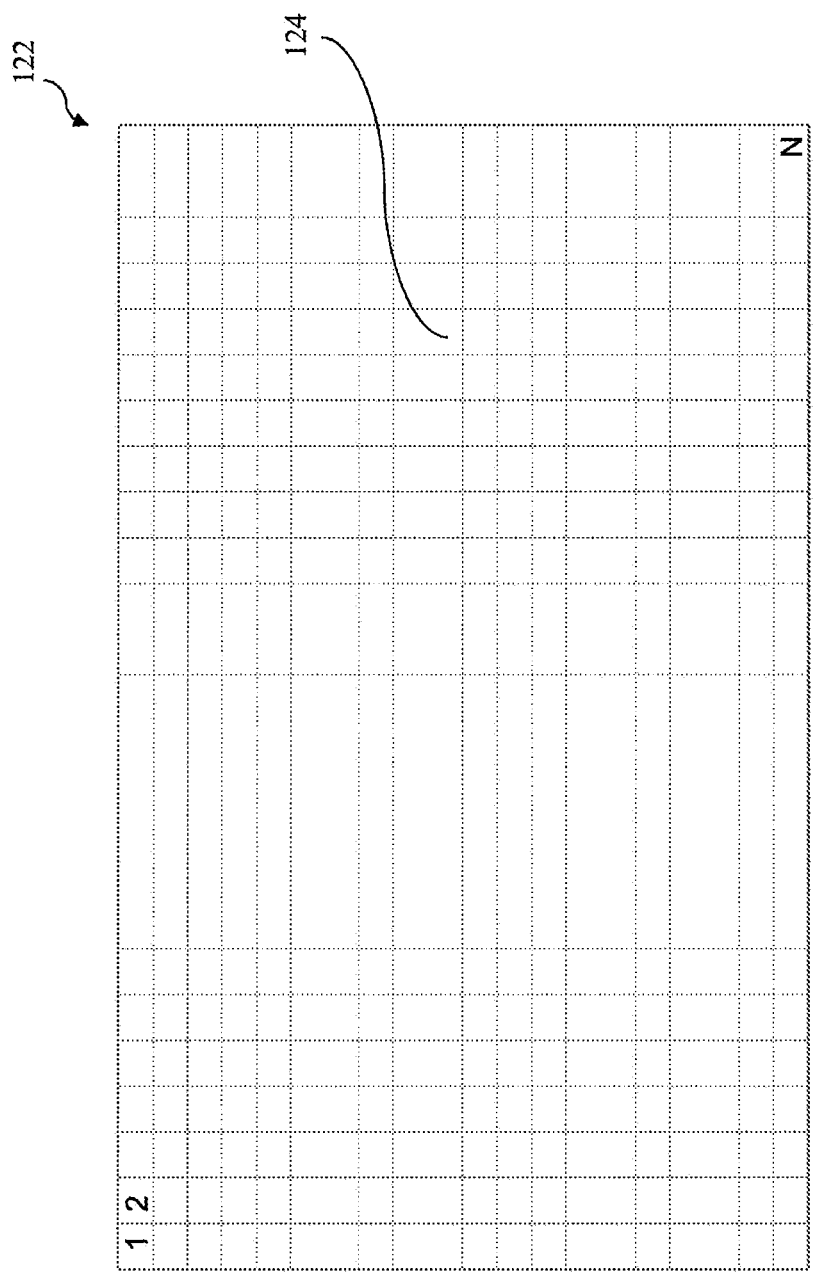
FIG. 3 is a schematic view of the semiconductor substrate of FIG. 2, in portion, constructed in accordance with some embodiments.

Referring to FIG. 3, each IC chip 122 is divided into a plurality of areas (also referred to as templates) 124 for subsequent operations. In the present embodiment, the templates 124 each have an equal area. The number of templates 124 in the full chip is "N". The templates 124 are referred to as 1, 2, 3, . . . , i, . . . and N, respectively. In the present example, each template 124 includes a rectangle or a square region in the semiconductor substrate 120. The number N may be determined by template size, which is closely related to e-beam model ambit (electron diffusion or convolution kernel range in μm). The number N may also be determined according to one or more factors, such as calculation efficiency. When the number N is large, the operations in the following process may take a longer time to complete. When the number N is small, the operations in the following process may take less time to complete, but may result in reduced optimization effectiveness. Accordingly, the number N is properly chosen according to one or more factors, such as engineer experience and/or previous processed data (such as historic data collected from execution of the method 100.

Figure 4:
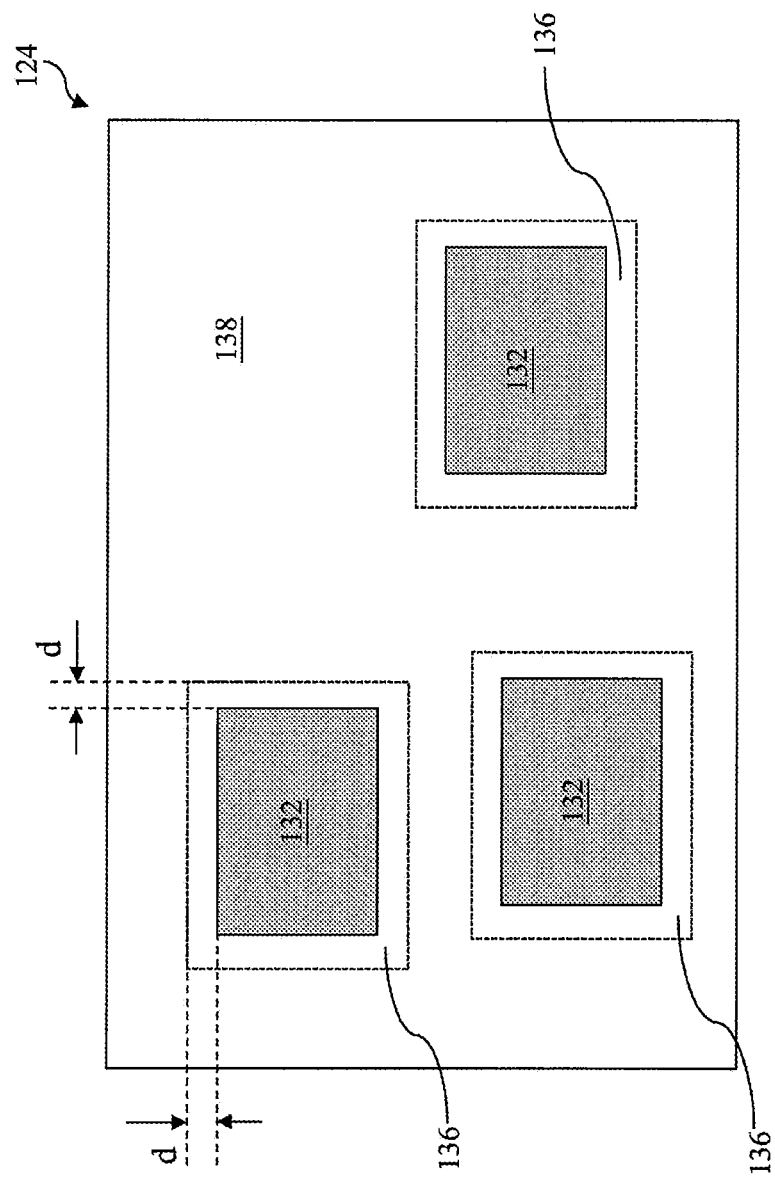
FIG. 4 illustrates an integrated circuit (IC) design layout constructed in accordance with some embodiments.

Referring to FIG. 4, the IC design layout to be formed on the chip is defined in various templates 124. Each template 124 includes a portion of the IC design layout. The IC design layout defined in different templates may be different from each other, depending on individual integrated circuit and the corresponding IC design layout.

The IC design layout includes main features 132 designed and configured to form a portion of the integrated circuit. A main feature is a geometrical pattern that defines an IC feature, such as contact/via hole, to be formed on the semiconductor substrate 120. A space isolation dimension (simply referred to as isolation distance) "d" is a parameter to define a forbidden area 136 surrounding a main feature 132, in which features (excluding dummy features) should not be inserted. The IC pattern in the template 124 includes a plurality of main features 132 and accordingly a plurality of forbidden areas 136 surrounding the respective main features 132. By excluding the main features 132 and the forbidden areas 136, the remaining regions in the semiconductor substrate are defined as space block(s) 138 for dummy insertion. The IC pattern includes the main features 132, the forbidden areas 136 and space block(s) 138.

Referring again to FIG. 1, the method 100 begins at step 102 by providing a main pattern density (PD) 210 of each template 124. The method 100 then proceeds to step 104 by choosing a PD target 310 with a PD target range $R_t$ for templates 124 and identifying PD outlier templates $124_{outlier}$ according to the PD target 310 and the PD target range $R_t$.

Figure 5:
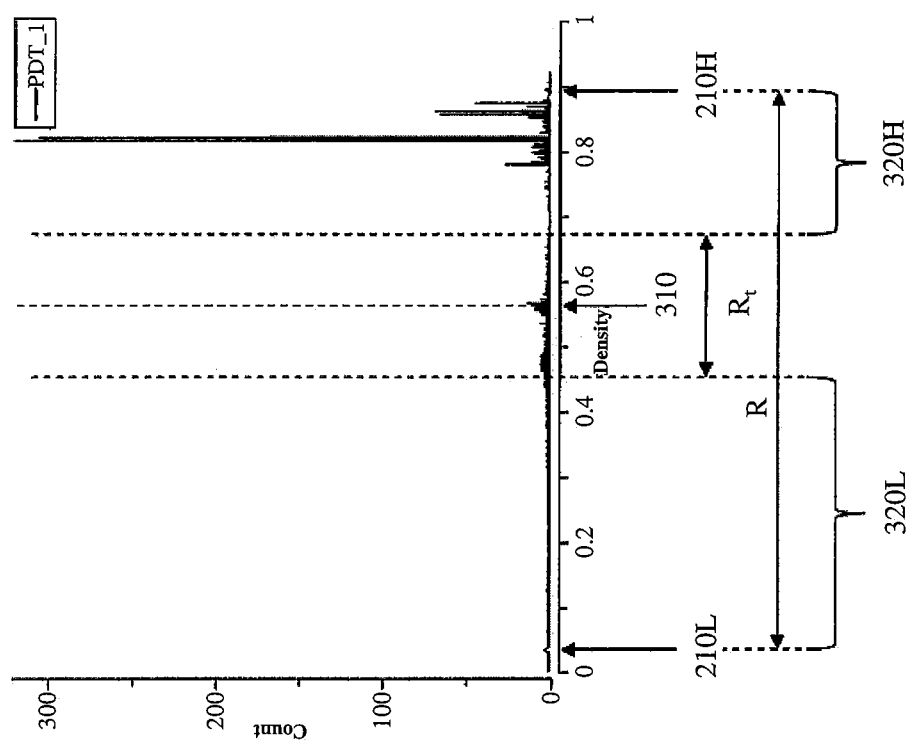
FIG. 5 illustrates a pattern density constructed in accordance with some embodiments.

In one embodiment, a PD analysis is performed first. For example, a PD histogram is generated (as shown in FIG. 5) and then a range R of the PD is calculated, which is from a lowest PD 210 (referred to as PD 210L) to a highest PD 210 (referred to as PD 210H). In the present embodiment, the PD target 310 is chosen to be smaller than a maximum PD defined by e-beam blur budget, referred to as $PD_{blur}$. In one embodiment, the PD target 310 is determined to be smaller than the $PD_{blur}$ and equal to the PD 210, which locates in half of the range R. The PD target range $R_t$ is then chosen to be substantial smaller than the range R. In one embodiment, the PD target range $R_t$ is chosen as +/−10% of the PD target 310.

After the PD target 310 and the PD target range $R_t$ are chosen, the template 124 having a PD that falls out of the PD target range $R_t$ is defined as the PD outlier template $124_{outlier}$. A template 124 is referred to as a low PD outlier template $124_{outlier}$ when its PD is lower than the PD target 310, now labeled with a reference number 320L. Similarly a template is referred to as a high PD outlier template $124_{outlier}$ when its PD is higher than the PD target 310, now labeled with a reference number 320H.

Referring again to FIG. 1, the method 100 proceeds to step 106 by performing a PD-outlier-treatment to the respective PD outlier template $124_{outlier}$. The method 100 has three paths starting from step 106, identified by the suffix "A", "B" and "C" respectively. The path A and path B provide two different PD-outlier-treatments for the high PD outlier template 320H and the path C provides a PD-outlier-treatment C for the low PD outlier template 320L. Every path is separately discussed below.

Figure 6:
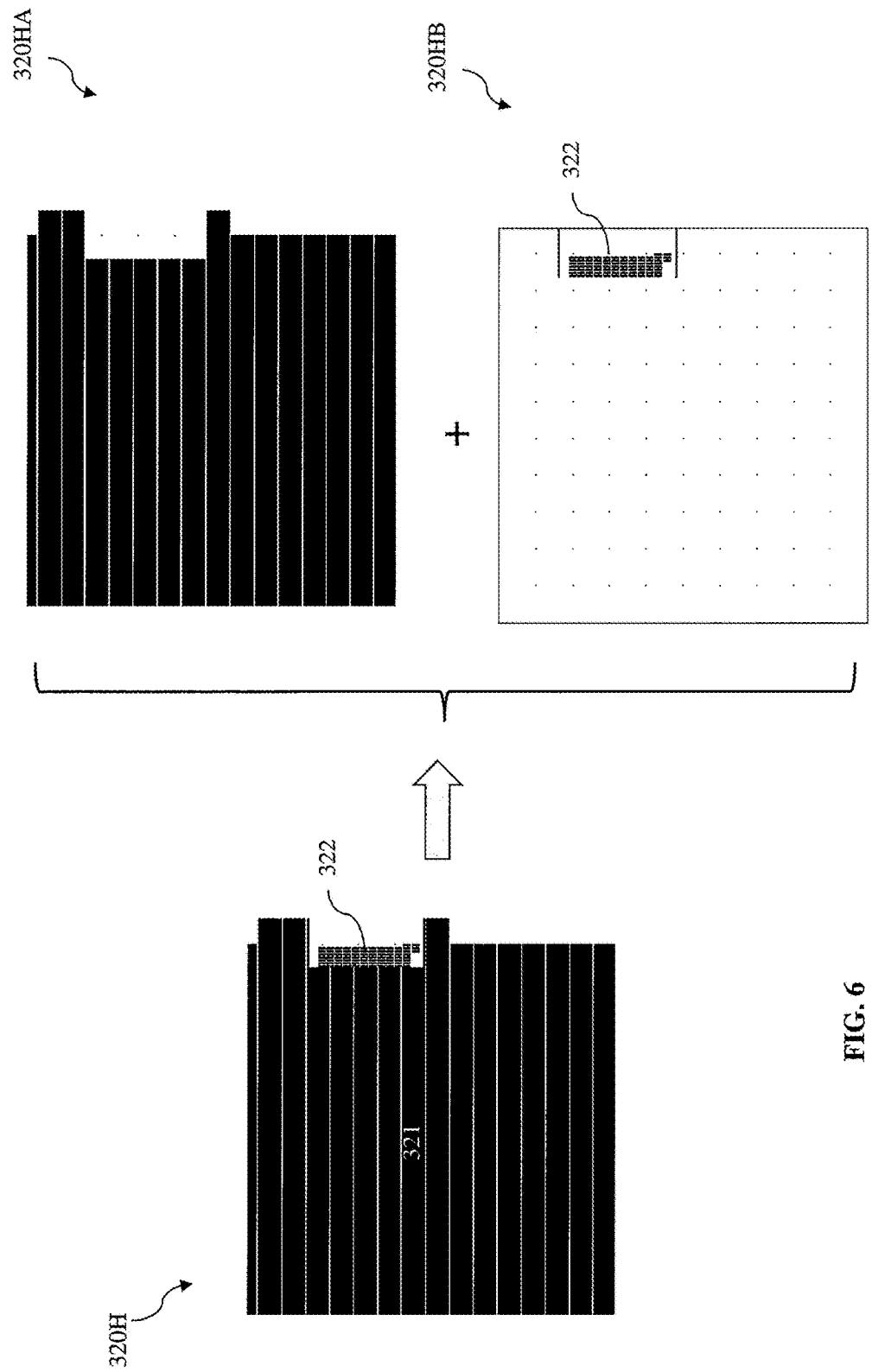
FIGS. 6-11 illustrate patterns of a template of an IC design layout constructed in accordance with some embodiments.

Referring to FIGS. 1 and 6, in path A, the method 100 proceeds to step 106A by performing a PD-outlier-treatment A to the high PD outlier template 320H. In one embodiment, the high PD outlier template 320H includes a first region 321 and a second region 322. The first region 321 and the second region 322 have a quite different pattern critical dimension (CD). For example, the first region 321 has a quite large pattern CD, such as 600 nm, while the second region 322 has a quite small pattern CD, such as 30 nm. In the PD-outlier-treatment A, the first region 321 is split into a first subset of template 320HA, and the second region 322 is split into a second subset of template 320HB.

Figure 7:
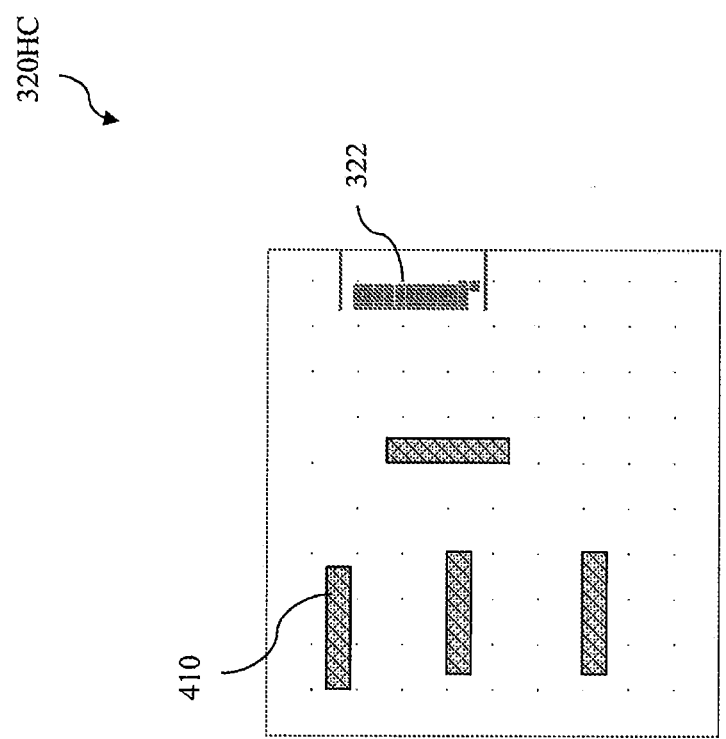

Referring to FIGS. 1 and 7, continuing in path A, the method 100 proceeds to step 108A by performing pattern density uniformity (PDU) optimization to the second subset of template 320HB and leaving the first subset of template 320HA with no further treatment at this step. The PDU optimization is described in the above-listed application that has been incorporated by reference. For example, in the PDU optimization, sub-resolution dummy features 410 are generated and inserted in the second subset of template 320HB to increase its PD, now labeled with a reference number 320HC. A size (and pitch), shape and type of sub-resolution dummy features 410 are chosen to make the PD of the subset of template 320HC satisfy the PD target 310 with the PD target range $R_t$.

Referring again to FIG. 1, the method 100 proceeds to step 110A by performing a first exposure process to the semiconductor substrate 120 using the first subset of template 320HA and a second exposure process to the semiconductor substrate 120 using the second subset of template 320HC, with different exposure dose than an exposure dose used in the first exposure process.

Figure 8:
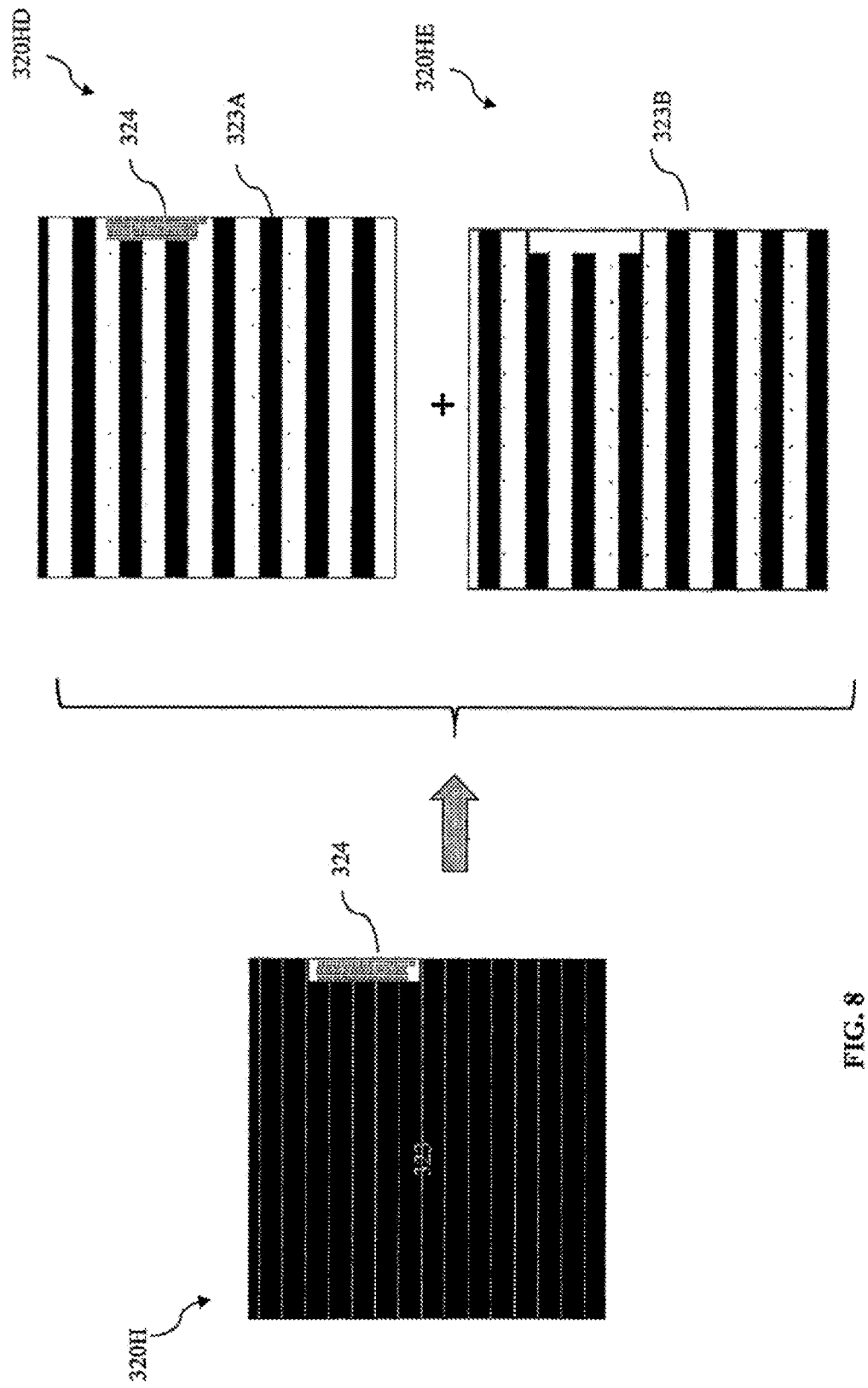

Referring to FIGS. 1 and 8, in path B, the method 100 proceeds to step 106B by performing the PD-outlier-treatment B to the high PD outlier template 320H. In one embodiment, the high PD outlier template 320H includes a third region 323 and a fourth region 324. Both of the third region 323 and the fourth region 324 has quite small pattern CDs. For example, a pattern CD of the third region 323 is about 50 nm and a pattern CD of the fourth region 324 is about 30 nm. Also, a high PD of the high PD outlier template 320H is mainly contributed by a PD of the third region 323. In the PD-outlier-treatment B, the high PD outlier template 320H is split into a multiple of subsets of template and each of subset of template carries a portion of the PD of the high PD outlier template 320H. Each PD of subsets of template satisfies the PD target 310, or is within the PD target range $R_t$.

In one embodiment, the high PD outlier template 320H is split into two subsets of template: a third subset of template 320HD and a fourth subset of template 320HE. The third subset of template 320HD carriers $X_1\%$ of the PD of the third region 323, referred to as 323A, and 100% of the PD of the fourth region 324. The fourth subset of template 320HE carries $X_2\%$ of the PD of the third region 323, referred to as 323B. A sum of the $X_1\%$ and $X_2\%$ of the PD of the third region 323 is equal to 100% of the PD of the third region 323. Each of PDs of the third subset of template 320HD and the fourth subset of template 320HE satisfies the PD target 310, or is within the PD target range $R_t$.

Figure 9:
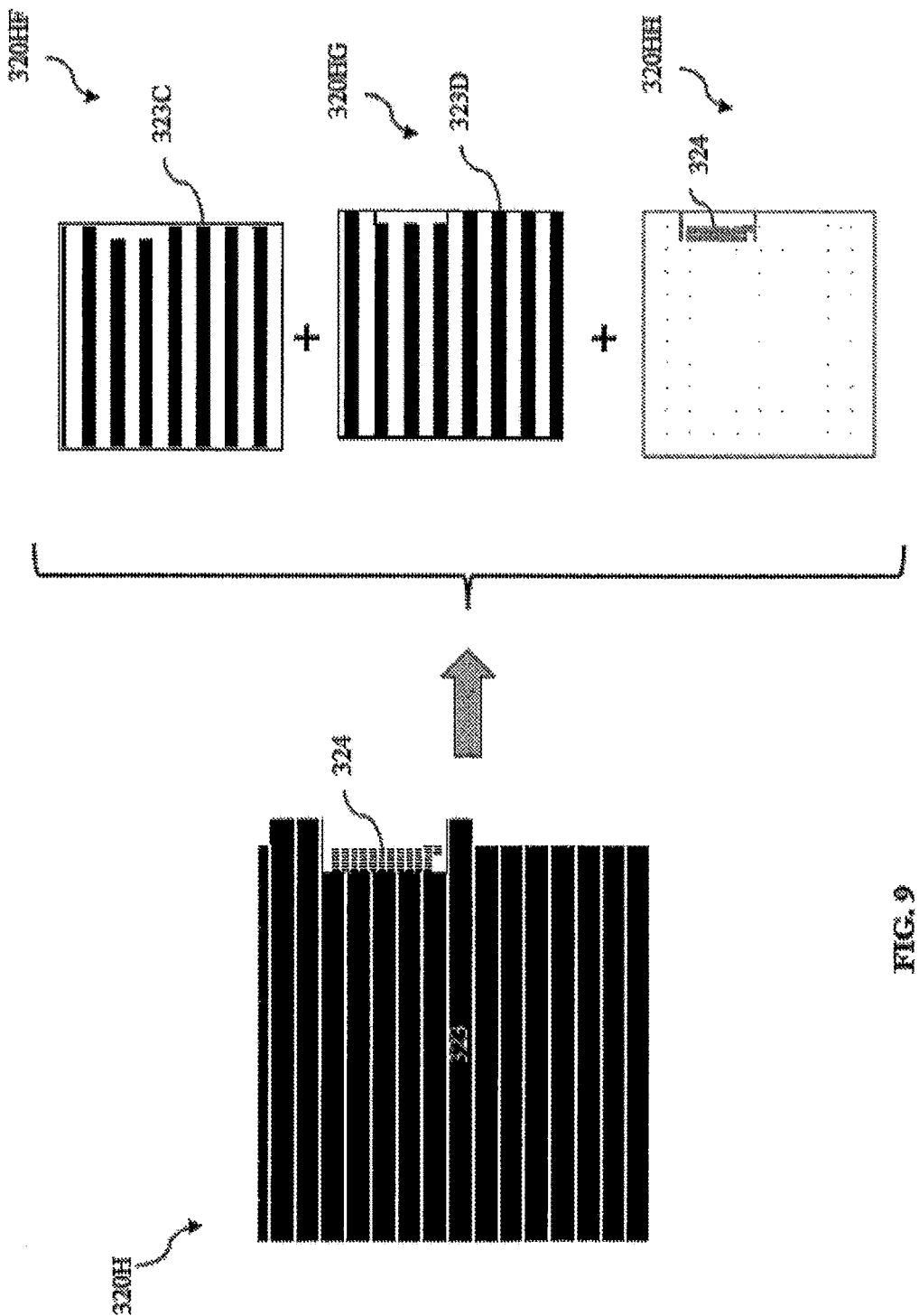

In another embodiment, alternatively, the high PD outlier template 320H is split into three subsets of template: a fifth, a sixth and a seventh subset of template, 320HF, 320HG and 320HH, respectively, as shown in FIG. 9. The fifth subset of template 320HF carries $X_3\%$ of a PD of the third region 323, referred to as 323C, and the sixth subset of template 320HG carries $X_4\%$ of the PD of the third region 323, referred to as 323D. A sum of the $X_3\%$ and $X_4\%$ of the PD of the third region 323 is equal to 100% of the PD of the third region 323. In the meantime, each of the $X_3\%$ and the $X_4\%$ of the PD of the third region 323 satisfies the PD target 310, or is within the PD target range $R_t$. The seventh subset of template 320HH carries 100% of the fourth region 324.

Figure 10:
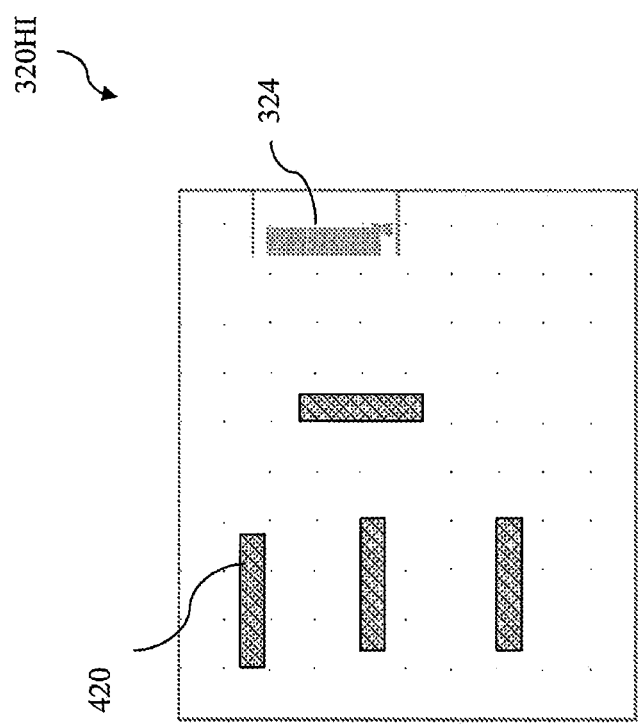

Referring to FIGS. 1 and 10, the method 100 proceeds to step 108B by performing a PDU optimization to the seventh subset of template 320HH and leaving the fifth and sixth of subsets of template, 320HF and 320G, (as well as the third and the fourth of subsets of template, 320HD and 320HE) with no further treatment at this step. The PDU optimization is described in the above-listed application that has been incorporated by reference. For example, in the PDU optimization, sub-resolution dummy features 420 are generated and inserted in the seventh subset template 320HH to increase its PD, now labeled with a reference number 320HI. A size (and pitch), shape and type of sub-resolution dummy features 420 are chosen to make the PD of the seventh subset template 320HI satisfy the PD target 310 with the PD target range $R_t$.

Referring again to FIG. 1, the method 100 proceeds to step 110B by performing individual exposure process to the semiconductor substrate 120 by using each of subsets of template. In one embodiment, a first exposure process is performed to the semiconductor substrate 120 using the third subset of template 320HD and a second exposure process is performed to the semiconductor substrate 120 using the fourth subset of template 320HE, with different exposure doses than to the first exposure process. In another embodiment, a third exposure process is performed to the semiconductor substrate 120 by using the fifth subset of templates 320HF, a fourth exposure process is then performed to the semiconductor substrate 120 by using the sixth subset of templates 320HG and a fifth exposure process is performed to the semiconductor substrate 120 by using the seventh subset of templates 320HI. Each of exposure dose of the third, fourth and fifth exposure process is different to each other.

Figure 11:
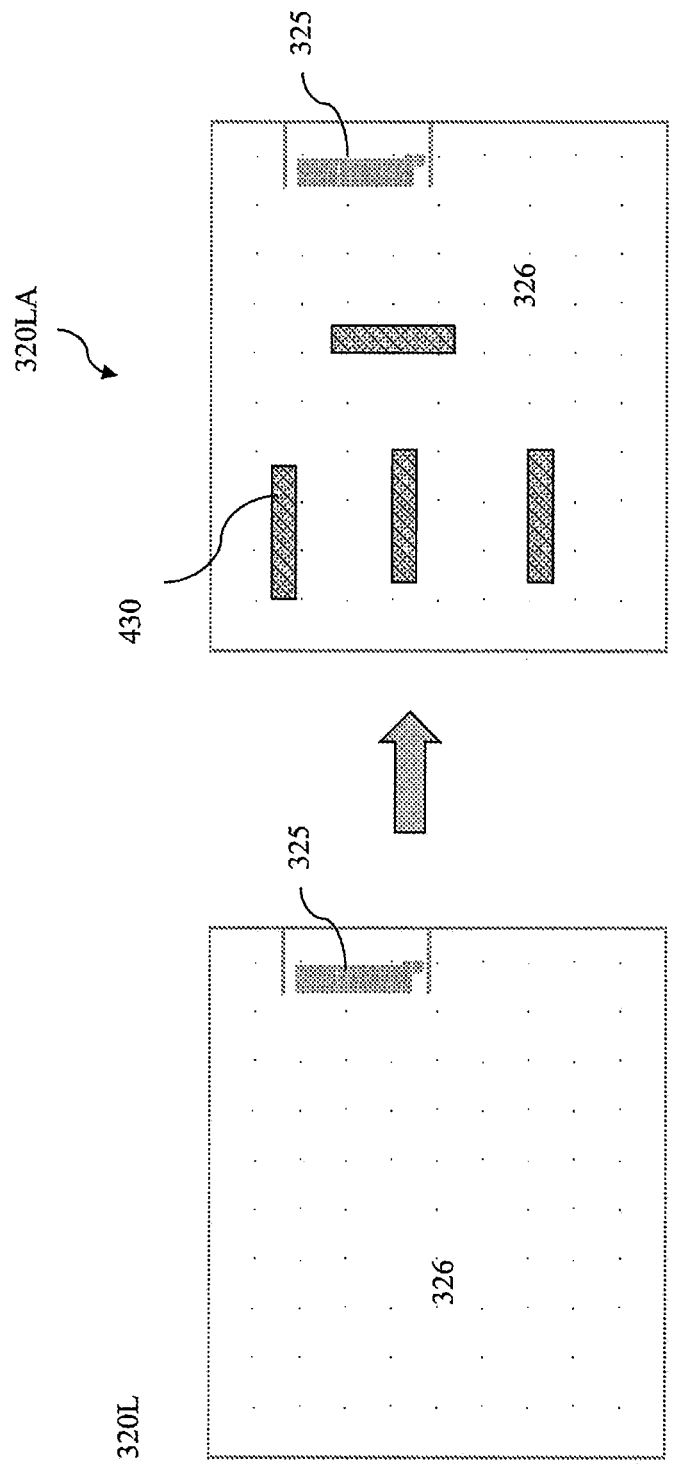

Referring to FIGS. 1 and 11, in path C, the method 100 proceeds to step 106C by performing the PD-outlier-treatment C to the low PD outlier template 320L. The low PD outlier template 320L may includes a fifth region 325 having main patterns and a background region 326 without main patterns. A PDU optimization is performed to the low PD outlier template 320L. The PDU optimization is described in the above-listed application that has been incorporated by reference. For example, in the PDU optimization, sub-resolution dummy features 430 are generated and inserted in the background region 326 to increase PD of the low PD outlier template 320L, referred to as a modified template 320LA. A size (and pitch), shape and type of sub-resolution dummy features 430 are chosen to make the PD of the modified template 320LA satisfies the PD target 310 with the PD target range.

Referring again to FIG. 1, the method 100 proceeds to step 108C by performing an exposure process to the semiconductor substrate 120 using the modified template 320LA.

Additional steps can be provided before, during, and after the method 100, and some of the steps described can be repeated, replaced, eliminated, or moved around for additional embodiments of the method 100. For example, steps from 104 to 108A, 108B and 106C may be repeated to bring PD of the template 124 to satisfy a new PD target with a new PD target range.

Based on the above, the present disclosure offers a method for fabricating a semiconductor device. The method employs identifying a PD outlier template, splitting the PD outlier template into a subset template and performing a PD-outlier-treatment on the subset template to eliminate PD outlier template and improve PD uniformity. The method also employs performing individual exposure process using respective the subset of template. The method demonstrates reducing space charge effect in e-beam lithography, improving uniformity of pattern density, improving process window and throughput.

Thus, the present disclosure provides one embodiment of an integrated circuit (IC) method. The IC method includes receiving pattern densities (PDs) with a first PD range r of a plurality of templates of an IC design layout, identifying a high PD outlier template and a low PD outlier template from the plurality of templates, splitting the high PD outlier template into multiple subsets of template, wherein each subset of template carries a portion of PD of the high PD outlier template, performing a PD uniformity (PDU) optimization to the low PD outlier template and performing multiple individual exposure processes using respective subset of templates.

The present disclosure provides another embodiment of an IC method. The method includes receiving pattern densities (PDs) with a first range r of a plurality of templates of an IC design layout, determining a PD target and a second range R, wherein the second range R is smaller than the first range r, wherein the PD target is chosen to be smaller than a maximum PD defined by an e-beam blur budget, according to the PD target and the second range R, identifying high PD outlier templates and low PD outlier templates from the plurality of the template, splitting the high PD outlier template into multiple subsets of templates. Each subset of templates carries a portion of PD of the high PD outlier template and a sum of PDs of each subset is equal to 100% of the PD of the PD outlier template. The method also includes inserting sub-resolution dummy feature in the low PD outlier templates and performing multiple individual exposure processes using the respective subset of templates.

The present disclosure also provides another embodiment of an IC method. The method includes receiving pattern densities (PDs) with a first range r of a plurality of templates of an IC design layout, determining a PD target and a second range R. The second range R is smaller than the first range R. The method also includes, according to the PD target and the second range R, identifying a high PD outlier template, which has a PD higher than the PD target, and a low PD outlier template, which has a PD lower than the PD target. The method also includes splitting the high PD outlier region into subsets of template, wherein each subset of template has a PD satisfies the PD target, or is within—the second range R. The method also includes performing PD uniformity (PDU) optimization to the second subset of templates and performing a first exposure process to the first subsets of template and a second exposure process to the second subset of templates, which uses a different exposure dose than the first exposure process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   identifying a first template having a first layout pattern with a first pattern density (PD) and a second template having a second layout pattern with a second PD less than the first PD;
   splitting the first template into a plurality of subset templates, wherein a first subset template has a first subset PD that is outside of a PD target, and wherein the second PD is outside of the PD target;
   performing a PD uniformity (PDU) optimization to both the first subset template and the second template to make the first subset PD and the second PD satisfy the PD target; and
   performing multiple individual electron beam (e-beam) lithography exposure processes with an e-beam lithography tool to a semiconductor substrate, using respective ones of the subset templates.

2. The method of claim 1, further comprising:
   prior to identifying the first template and the second template, determining a PD for the first template and the second template, wherein the determining the PD provides a first range of pattern densities.

3. The method of claim 2, wherein the first template and the second template are identified by:
   determining the PD target having a second range of pattern densities, wherein the second range of pattern densities is less than the first range of pattern densities; and
   based on the PD target and the second range of pattern densities, defining the first template and the second template, wherein the first template has the first PD which is greater than the PD target and also out of the second range of pattern densities, and wherein the second template has the second PD which is less than the PD target and also out of the second range of pattern densities.

4. The method of claim 1, wherein the PD target is chosen to be less than a PD defined by an e-beam blur budget.

5. The method of claim 3, wherein the first template includes a first region and a second region, wherein the first region has a third PD and a first critical dimension (CD), and wherein the second region has a fourth PD less than the third PD and a second CD less than the first CD.

6. The method of claim 5, wherein the second region is split into the first subset template and the first region is split into a second subset template.

7. The method of claim 6, wherein the PDU optimization is performed by inserting a sub-resolution dummy feature into the portion of the IC layout pattern defined by the first subset template.

8. The method of claim 6, wherein performing the multiple individual e-beam lithography exposure processes includes:
   performing a first e-beam lithography exposure process to the semiconductor substrate using the first subset template, wherein the first e-beam lithography exposure process is performed using a first exposure dose; and
   after performing the PDU optimization, performing a second e-beam lithography exposure process to the semiconductor substrate using the second subset template, wherein the second e-beam lithography exposure process is performed using a second exposure dose which is different than the first exposure dose.

9. The method of claim 3, wherein the first template includes a third region and a fourth region, wherein the third region has a third PD and a first CD, and wherein the fourth region has a fourth PD less than the third PD and a second CD less than the first CD.

10. The method of claim 9, wherein the third region is split into a third subset template and a fourth subset template such that:
    the third subset template includes $X_1$% of the third PD of the third region;
    the fourth subset template includes $X_2$% of the third PD of the third region and 100% of the fourth PD of the fourth region;
    a total of the $X_1$% of the third PD plus the $X_2$% of the third PD is equal to 100% of the third PD of the third region; and
    the $X_1$% of the third PD of the third region and the $X_2$% of the third PD of the third region each satisfy the PD target, or are within the second range of pattern densities.

11. The method of claim 10, wherein performing the multiple individual e-beam lithography exposure processes includes:
    performing a third e-beam lithography exposure process to the semiconductor substrate using the third subset template, wherein the third e-beam lithography exposure process is performed using a first exposure dose; and
    performing a fourth e-beam lithography exposure process to the semiconductor substrate using the fourth subset template, wherein the fourth e-beam lithography exposure process is performed using a second exposure dose which is different than the first exposure dose.

12. The method of claim 9, wherein the third region is split into a fifth subset template and a sixth subset template and the fourth region is split into a seventh subset template such that:
the fifth subset template includes $X_3$% of the third PD of the third region;
the sixth subset template includes $X_4$% of the third PD of the third region;
the seventh subset template includes 100% of the fourth PD of the fourth region;
a total of the $X_3$% of the third PD plus the $X_4$% of the third PD is equal to 100% of the third PD of the third region; and
the $X_3$% of the third PD of the third region and the $X_4$% of the third PD of the third region each satisfy the PD target, or are within the second range of the pattern densities.

13. A method of semiconductor device fabrication, comprising:
based on an e-beam blur budget, determining a pattern density (PD) target having a second range of pattern densities;
based on the PD target and the second range of pattern densities, identifying, from a plurality of templates, a first template having a first layout pattern with a first PD and a second template having a second layout pattern with a second PD less than the first PD;
splitting the first template into a plurality of subset templates, wherein each subset template of the plurality of subset templates includes a portion of the first layout pattern and a percentage of the first PD, wherein a total of the percentages of the first PD of each subset template adds up to 100% of the first PD of the first template; and wherein a first subset template has a subset PD that is outside of the PD target;
inserting a sub-resolution dummy feature into the portion of the IC layout pattern defined by the first subset template and the second template to perform a PD uniformity (PDU) optimization to the first subset template and the second template; and
performing multiple individual electron beam (e-beam) lithography exposure processes with an e-beam lithography tool to a semiconductor substrate, using respective ones of the subset templates.

14. The method of claim 13, further comprising:
prior to determining the PD target, determining the PD for each template of the plurality of templates, wherein the determining the PD provides a first range of pattern densities; and
determining the PD target, wherein the second range of pattern densities is less than the first range of pattern densities.

15. The method of claim 13, wherein the first template includes a first region and a second region, wherein the first region has a third PD and a first critical dimension (CD), and wherein the second region has a fourth PD less than the third PD and a second CD less than the first CD.

16. The method of claim 15, wherein the first region is split into a second subset template and a third subset template such that:
the second subset template includes $X_1$% of the third PD of the first region;
the third subset template includes $X_2$% of the third PD of the first region and 100% of the fourth PD of the second region;
a total of the $X_1$% of the third PD plus the $X_2$% of the third PD is equal to 100% of the third PD of the first region; and
the $X_1$% of the third PD of the first region and the $X_2$% of the third PD of the first region each satisfy the PD target, or are within the second range of pattern densities.

17. The method of claim 16, wherein performing the multiple individual e-beam lithography exposure processes includes:
performing a first e-beam lithography exposure process to the semiconductor substrate using the second subset template, wherein the first e-beam lithography exposure process is performed using a first exposure dose; and
performing a second e-beam lithography exposure process to the semiconductor substrate using the third subset template, wherein the second e-beam lithography exposure process is performed using a second exposure dose which is different than the first exposure dose.

18. The method of claim 15, wherein the first region is split into a fourth subset template and a fifth subset template and the second region is split into a sixth subset template such that:
the fourth subset template includes $X_3$% of the third PD of the first region;
the fifth subset template includes $X_4$% of the third PD of the first region and the sixth subset template includes 100% of the fourth PD of the second region:
a total of the $X_3$% of the third PD plus the $X_4$% of the third PD is equal to 100% of the third PD of the first region; and
the $X_3$% of the third PD of the first region and the $X_4$% of the third PD of the first region each satisfy the PD target, or are within the second range of pattern densities.

19. A method of semiconductor device fabrication, comprising:
determining a pattern density (PD) target;
based on the PD target, identifying a first template including a first layout pattern with a first PD and a second template including a second layout pattern with a second PD less than the first PD;
splitting the first template into a plurality of subset templates including at least a first subset template and a second subset template, wherein the first subset template has a subset PD that satisfies the PD target,
performing a PD uniformity (PDU) optimization to the second template and to the second subset template; and
performing a first e-beam lithography exposure process with an e-beam lithography tool to the semiconductor substrate using the first and second subset templates.

20. The method of claim 19, further comprising:
prior to determining the PD target, determining a PD for each template of a plurality of templates, wherein the determining the PD provides a first range of pattern densities;
determining the PD target, wherein a second range of pattern densities of the PD target is less than the first range of pattern densities;
identifying the first template, wherein the first PD is greater than the PD target, and the second template, wherein the second PD is less than the PD target; and splitting the first template, wherein at least one subset template of the plurality of subset templates has a subset PD that is within the second range of pattern densities.

\* \* \* \* \*